United States Patent
Harkin

(10) Patent No.: US 9,906,159 B2
(45) Date of Patent: Feb. 27, 2018

(54) CONTROLLER FOR A VOLTAGE CONVERTER

(75) Inventor: Richard Lee Harkin, Worthing (GB)

(73) Assignee: Edwards Limited, Burgess Hill (GB)

( * ) Notice: Subject to any disclaimer, the term of this patent is extended or adjusted under 35 U.S.C. 154(b) by 80 days.

(21) Appl. No.: 14/237,281

(22) PCT Filed: Aug. 3, 2012

(86) PCT No.: PCT/GB2012/051886
§ 371 (c)(1),
(2), (4) Date: May 6, 2014

(87) PCT Pub. No.: WO2013/021179
PCT Pub. Date: Feb. 14, 2013

(65) Prior Publication Data
US 2015/0078043 A1   Mar. 19, 2015

(30) Foreign Application Priority Data

Aug. 5, 2011 (GB) .................................. 1113523.3
Aug. 1, 2012 (GB) .................................. 1213687.5

(51) Int. Cl.
*H02M 7/10* (2006.01)
*H02M 1/10* (2006.01)
(Continued)

(52) U.S. Cl.
CPC ............... *H02M 7/10* (2013.01); *H02M 1/10* (2013.01); *G01R 19/04* (2013.01);
(Continued)

(58) Field of Classification Search
CPC ...... H02M 5/4585; H02M 5/458; H02M 1/32; H02M 7/06; H02M 3/33592; H02M 3/07;
(Continued)

(56) References Cited

U.S. PATENT DOCUMENTS 4,277,692 A * 7/1981 Small ...................... H02J 9/062
307/66
4,845,607 A   7/1989 Nakao et al.
(Continued)

FOREIGN PATENT DOCUMENTS

CN   1277487 A   12/2000
CN   1068995 C    7/2001
(Continued)

OTHER PUBLICATIONS

First Office Action and Translation thereof dated Aug. 7, 2015 in counterpart CN Application No. 201280037367.X, 29 pages.
(Continued)

*Primary Examiner* — Nguyen Tran
(74) *Attorney, Agent, or Firm* — Shumaker & Sieffert, P.A.

(57) ABSTRACT

In some examples, a control module for a voltage converter may have an input for connection to an AC supply having an operating voltage range. A first detector is provided for detecting the operating voltage range of the AC supply and generating a first control signal to identify the detected operating voltage range. A second detector is also provided for detecting the operating voltage range of the AC supply and generating a second control signal to identify the detected operating voltage range. The control module has one or more switches for selectively enabling and/or disabling a voltage multiplier in response to said first and second control signals. The present disclosure also relates to a method of controlling a voltage converter.

25 Claims, 8 Drawing Sheets

(51) Int. Cl.
G01R 19/04 (2006.01)
G01R 19/165 (2006.01)
H02M 1/36 (2007.01)
H02M 1/08 (2006.01)
H02M 1/32 (2007.01)
H02M 5/458 (2006.01)

(52) U.S. Cl.
CPC ......... *G01R 19/16547* (2013.01); *H02M 1/08* (2013.01); *H02M 1/32* (2013.01); *H02M 1/36* (2013.01); *H02M 5/4585* (2013.01)

(58) Field of Classification Search
CPC .... H02M 7/10; H02M 1/10; H02J 3/36; H02J 9/062; Y02B 70/1262; Y02B 70/12623; H02L 27/0248; H02H 9/542; H02H 7/262; H02H 7/267; H02H 3/063; H02H 3/08; H02K 17/136
USPC ............ 363/34–36, 37, 44, 50–53, 125–127, 363/59–6; 361/1, 2, 6, 62–67, 87–94, 361/100, 115–118; 307/64–66
See application file for complete search history.

(56) References Cited

U.S. PATENT DOCUMENTS

| | | | |
|---|---|---|---|
| 5,162,984 A | 11/1992 | Castagnet et al. | |
| 5,506,743 A * | 4/1996 | Phillips | H02H 7/09 361/85 |
| 5,959,857 A | 9/1999 | Nagahara | |
| 6,218,744 B1 * | 4/2001 | Zahrte, Sr. | G05F 1/14 307/64 |
| 6,515,379 B1 | 2/2003 | Nojima et al. | |
| 8,094,471 B1 * | 1/2012 | Smith | H02M 1/10 363/61 |
| 2003/0099070 A1 * | 5/2003 | Macbeth | H02H 1/0015 361/5 |
| 2005/0088860 A1 * | 4/2005 | Okuma | H02J 9/062 363/35 |
| 2010/0073977 A1 * | 3/2010 | Nakamoto | H02M 1/4208 363/126 |

FOREIGN PATENT DOCUMENTS

| | | |
|---|---|---|
| CN | 201378801 Y | 1/2010 |
| EP | 0284412 A2 | 9/1988 |
| JP | H01202165 | 8/1989 |
| JP | 05030729 | 2/1993 |
| JP | H0530729 A | 2/1993 |
| JP | 05292749 | 11/1993 |
| JP | 06054537 | 2/1994 |
| JP | 2000350458 | 12/2000 |
| JP | 2009092044 A | 4/2009 |
| JP | 2010178594 | 8/2010 |

OTHER PUBLICATIONS

Transmittal of the International Search Report and the Written Opinion of the International Searching Authority dated Oct. 8, 2013 in corresponding PCT Application No. PCT/GB2012/051886, 13 pgs.
Search Report under Section 17(5) dated Jan. 17, 2012 in corresponding GB Application No. 1113523.3, 4 pgs.
Office Action, and translation thereof, from counterpart Japanese Patent Application No. 2014-52442, dated May 26, 2016, 5 pp.
Third Office Action, and translation thereof, from counterpart Chinese Patent Application No. 201280037367.X dated Aug. 31 2016, 31 pages.
Second Office Action, and translation thereof, from counterpart Chinese Patent Application No. 201280037367.X, dated Feb. 23, 2016, 27 pp.
Communication pursuant to Article 94(3) EPC from counterpart European Application No. 12758586.7, dated Aug. 25, 2017, 6 pp.

* cited by examiner

CONTROLLER FOR A VOLTAGE CONVERTER

This application is a National Stage Entry of International Application No. PCT/GB2012/051886, filed Aug. 3, 2012, which claims the benefit of G.B. Application No. 1213687.5, filed Aug. 1, 2012 and G.B. Application No. 1113523.3, filed Aug. 5, 2011. The entire contents of each of International Application No. PCT/GB2012/051886, G.B. Application No. 1213687.5, and G.B. Application No. 1113523.3 are incorporated herein by reference.

TECHNICAL FIELD

The present disclosure relates to a controller for a voltage converter.

BACKGROUND

The controller according to the present disclosure has particular application for controlling a voltage converter in a power supply for a vacuum pump. However, the controller could find application in a broad range of technical fields.

It is well known to power vacuum pumps from an AC mains supply. However, the AC mains supply conditions differ in different territories and may be supplied with the following conditions: (i) 100-127 Vac RMS, +/−10%, 45-65 Hz; or (ii) 200-240 Vac RMS, +/10%, 45-65 Hz. The different mains supply voltages can prove problematic for systems and apparatus to be used in a variety of territories. If too high a voltage is supplied, the systems and apparatus may be damaged. In order to accommodate the different mains supply conditions, a variety of solutions have been proposed, including:
1. Separate low-voltage and high-voltage variant pumps or pump controllers.
2. Manual voltage selector, which requires customer intervention to be set at the correct voltage.
3. Over designed converter and Inverter Power-Train sub-systems designed to run at the highest possible voltage and current.
4. Active front end devices designed to constantly monitor and output a set voltage.

However, these manufacturing and design solutions can be expensive to implement and have EMC (Electromagnetic Compatibility) and thermal issues.

It is also known to provide a voltage doubler topology, but the standard approach is to fix the voltage doubler so that it is permanently enabled. Alternatively, a voltage selector switch may be provided to allow a user to select the state of the voltage doubler, i.e. enabled or disabled. If the incorrect state is selected, damage may be caused to the system as a result of the increased voltage supplied.

The present disclosure seeks to address or ameliorate some of the short-comings associated with known techniques.

SUMMARY

Viewed from a first aspect, the present disclosure relates to control module for a voltage converter, the control module comprising: an input for connection to an AC supply having an operating voltage range; a first detector for detecting the operating voltage range of the AC supply and generating a first control signal to identify the detected operating voltage range; a second detector for detecting the operating voltage range of the AC supply and generating a second control signal to identify the detected operating voltage range; and one or more switches for selectively enabling and/or disabling a voltage multiplier in response to said first and second control signals.

The control module can provide a universal-voltage single-phase controller suitable for a vacuum-pump system. At least in a preferred arrangement, the control module can automatically switch between a low-voltage single phase input supply to a high voltage single-phase supply. No manual intervention is required to configure the control module for different AC input supply voltages. Rather, the one or more switches enable or disable the voltage multiplier topology dependent on the AC input supply voltage. Thus, the control module can be operable without the need for reconfiguration.

The first detector can comprise a first latch for latching the first control signal once the detected operating voltage range has been identified. The second detector can comprise a second latch for latching the second control signal once the detected operating voltage range has been identified. Alternatively, or in addition, a latch can be associated with said one or more switches to latch the voltage multiplier in an enabled/disabled state. The latch(es) can, for example, be overridden when there is a DC link over-voltage trip and/or a system power down.

The control module can form part of a front-end power-train converter (AC to DC Power Converter) which is capable of operating over a wide single-phase input supply range.

The provision of first and second detectors provides redundancy within the control module which can facilitate safe and reliable operation. In particular, since the operating voltage is detected by two detectors, the likelihood of the voltage multiplier being enabled in error may be reduced. Also, providing first and second detectors may allow a failsafe operating mode.

A logic circuit can be provided for controlling said one or more switches in response to said first and second control signals. The switch or switches can be configured to enable and/or disable the voltage multiplier only when the first and second control signals both identify the same detected operating voltage range. For example, the voltage multiplier may be enabled/disabled when the first and second control signals both identify a voltage range which is low or high respectively.

The one or more switches can be configured to enable the voltage multiplier when the first control signal and the second control signal both identify a low detected operating voltage range. For example, if the first and second detectors both detected an operating voltage of approximately 120 Vac RMS this would be considered as being a low voltage range and the one or more switches would enable the voltage multiplier.

Conversely, the one or more switches can be configured to disable the voltage multiplier when the first control signal and the second control signal both identify a high detected operating voltage range. For example, if the first and second detectors both detected an operating voltage of approximately 240 Vac RMS this would be considered as being a high voltage range and the one or more switches would disable the voltage multiplier.

The first detector and the second detector can be capable of operating independently of each other. The first detector and the second detector may detect the operating voltage range concurrently.

The first detector and/or the second detector could be implemented in hardware (i.e. without firmware). The first detector and/or the second detector could be implemented in a combination of hardware and firmware.

Alternately, the first detector can be implemented in hardware and the second detector can be implemented in a combination of hardware and firmware. A combination of electronic hardware and firmware thereby enables/disables the voltage multiplier. Two independent hardware circuits can be employed to detect the AC mains input supply voltage. The use of two circuits provides redundancy within the design hence providing safety under "Single-Fault" conditions.

By detecting the AC mains supply, via the two independent detection circuits, the control module can select the appropriate converter topology.

The control module can further comprise at least one hysteresis control block for controlling the first control signal and/or the second control signal. The hysteresis control can prevent erroneous switching of the first control signal and/or the second control signal, for example due to signal noise.

The control module can further comprise a disarming circuit for disabling the control module during power-up. The disarming circuit may comprise a timer for disabling the control module for a period of time immediately following power-on. For example, the disarming circuit could disable the first detector and/or the second detector.

A first switch for enabling/disabling the voltage multiplier can be associated with the first detector and a second switch for enabling/disabling the voltage multiplier can be associated with the second detector.

The voltage multiplier can be a voltage doubler.

The input can be adapted for connection to an AC mains supply. The AC mains supply can provide a 90-140 Vac RMS supply (referred to herein as a low voltage range) or a 180-264 Vac RMS supply (referred to herein as a high voltage range).

The present disclosure also relates to a voltage converter comprising a control module as described herein and a voltage multiplier. The voltage converter can comprise a first converter and a second converter. The first converter can comprise a single-phase four-pulse bridge rectifier with DC Link Capacitance. The second converter can comprise a single-phase two-pulse bridge rectifier with a voltage doubler arrangement and a split DC link capacitance.

The control module may automatically detect the AC mains input supply during initial power-up. The detection can provide a combined decision based on the first and second control signals generated by said first and second detectors. The combined decision may determine which topology to select, i.e. to disable or enable the voltage doubler arrangement.

The control module or voltage converter described herein can be incorporated into a pump unit. The pump unit may comprise a pump controller, a motor controller and a pump motor. The use of a multiplier topology enables the control module to be optimized for a particular pumping application.

Viewed from a further aspect, the present disclosure relates to a method of controlling a voltage converter, the method comprising the steps of: (a) receiving an AC supply having an operating voltage range; (b) using a first detector to detect the operating voltage range of the AC supply and generating a first control signal to identify the detected operating voltage range; (c) using a second detector to detect the operating voltage range of the AC supply and generating a second control signal to identify the detected operating voltage range; and (d) enabling and/or disabling a voltage multiplier in response to said first and second control signals.

The voltage multiplier can be enabled and/or disabled only when the first and second control signals both identify the same detected operating voltage range. For example, if the first and second detectors both determine that the AC supply has a low operating voltage range, the voltage multiplier will be enabled. Conversely, if the first and second detectors both determine that the AC supply has a high operating voltage range, the voltage multiplier will be disabled.

Viewed from a further aspect, the present disclosure relates to a voltage multiplier control circuit comprising: a voltage level detector for detecting the operating voltage range of an AC supply; a signal generator for generating a control signal to identify the detected operating voltage range; a switch for enabling and/or disabling a voltage multiplier in response to said control signal.

The voltage multiplier control circuit can also comprise a hysteresis circuit for controlling the control signal.

The voltage multiplier control circuit can further comprise a disarming circuit for disabling the control module during power-up. The disarming circuit may comprise a timer. The disarming circuit can disable the voltage level detector for a period of time.

The hysteresis circuit can be a hardware circuit.

The disarming circuit can be a hardware circuit.

The voltage multiplier control circuit can be implemented in hardware.

The voltage multiplier control circuit can provide a universal-voltage single-phase controller suitable for a vacuum-pump system. At least in a preferred arrangement, the voltage multiplier control circuit can automatically switch between a low-voltage single phase input supply to a high-voltage single-phase supply. The one or more switches enable or disable the voltage multiplier topology dependent on the AC input supply voltage. The voltage multiplier control circuit may be operable without the need for reconfiguration by a user.

The voltage multiplier control circuit can form part of a front-end power-train converter (AC to DC Power Converter) which is capable of operating over a wide single-phase input supply range.

The switch can be configured to enable and/or disable the voltage multiplier when the first control signal identifies a high voltage range or a low voltage range. For example, if the detector detects an operating voltage of approximately 120 Vac RMS this would be considered as being a low voltage range and the switch would enable the voltage multiplier.

The voltage multiplier control circuit may comprise a peak detector for detecting the peak voltage of the AC supply. The peak detector can output a signal to identify the peak voltage detected to the voltage level detector. The voltage doubler control circuit may comprise a feedback buffer for protecting the signal output from the peak detector.

The AC supply can be an AC mains supply.

The present disclosure also relates to a control module comprising a plurality of voltage multiplier control circuits as described herein. The voltage multiplier control circuits may be operable concurrently to detect the operating voltage range of the AC supply.

The control signal(s) from the voltage multiplier control circuit(s) can be input into a logic control circuit.

Viewed from a yet further aspect, the present application relates to a method of controlling a voltage multiplier, the method comprising the steps of: (a) receiving an AC supply having an operating voltage range; (b) using a detector to detect the operating voltage range of the AC supply and generating a control signal to identify the detected operating voltage range; and (c) enabling and/or disabling a voltage multiplier in response to said control signal.

BRIEF DESCRIPTION OF DRAWINGS

Examples will now be described, by way of example only, with reference to the accompanying Figures, in which.

DETAILED DESCRIPTION

Figure 1:
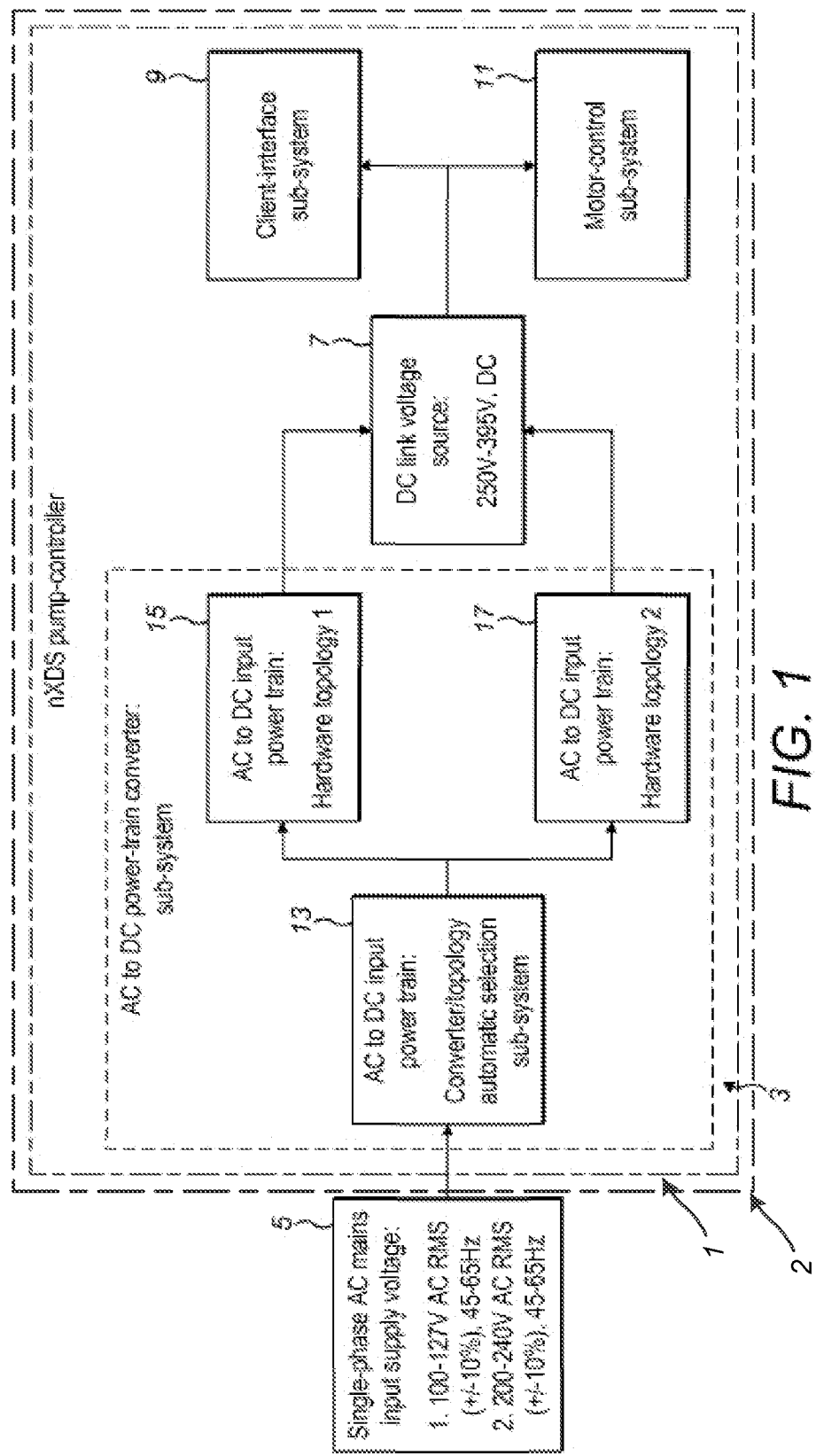
FIG. 1 shows a block diagram of a system incorporating an AC to DC power-train converter according to the present disclosure.

A schematic overview of a pump controller 1 incorporating an AC-to-DC power-train converter 3 in accordance with the present disclosure is shown in FIG. 1. The disclosure will be described with reference to the pump controller 1 but it will be appreciated that it can be implemented in other applications. In the present embodiment, the pump controller 1 is configured to control a pump 2 comprising a conventional 3-phase AC induction motor having a radial air-gap. The pump controller 1 can be incorporated into pump 2. The pump 2 may comprise pump controller 1, a motor controller and a pump motor.

The AC-to-DC power-train converter 3 is a front-end power converter coupled to a single phase AC mains voltage source 5 having supply conditions of either: (a) 100-127 Vac RMS+/−10%, 45-65 Hz; or (b) 200-240 Vac RMS, +/−10%, 45-65 Hz. The AC-to-DC power-train converter 3 detects the supply voltage of the AC mains voltage source 5 and, based on the detected range of the supply voltage, automatically controls the AC-to-DC conversion to provide a DC link voltage in the range 254 Vdc to 396 Vdc. A DC link voltage source 7 provides the DC Link voltage, which is the primary voltage source within the pump controller 1 for providing both pump system and (pump) motor control functionality. The link voltage source 7 is connected to a client interface sub-system 9 and a motor-control subsystem 11. The client interface sub-system 9 comprises a DC-DC flyback converter to provide live and PELV (Protective Extra Low Voltage) control voltages within the pump controller 1.

The AC-to-DC power-train converter 3 comprises a control module 13 for automatically detecting the AC mains supply and enabling an appropriate AC-to-DC converter 15, 17 based on the detected range of the AC mains supply. In the present embodiment a combined Voltage-Doubler and 2-pulse bridge rectifier has been implemented which effectively switches between the respective topologies. The control module 13 selectively engages a first AC-to-DC converter 15, with the voltage doubler disabled, if the detected AC supply voltage is in the range 180-264 Vac RMS (herein referred to as a high voltage range); or a second AC-to-DC converter 17, with the voltage doubler enabled, if the detected AC supply voltage is in the range 90-140 Vac RMS (herein referred to as a low voltage range). The first AC-to-DC converter 15 comprises a single-phase two-pulse bridge rectifier with DC link capacitance; and the second AC-to-DC converter 17 comprises a single-phase two-pulse bridge rectifier with a voltage doubler arrangement and split DC link capacitance. This design creates a DC Link voltage range of 250 Vdc-395 Vdc suitable for a 3-phase motor having 180V AC RMS, 650 W, 60 Hz and providing an operating current in the region of 3.0 A RMS-4.2 A peak.

The AC-to-DC power-train converter 3 according to the present embodiment provides the following functionality:

Automatic Control/Topology Switching—reducing or avoiding the need for customer intervention.

Safety—in the event of a single failure mode, the pump controller 1 should maintain the DC Link voltage to a safe level which is within the product specification.

Safe & Controlled Start-Up—when the AC input supply is first applied to the Pump-System the voltage-doubler topology should be disabled. This topology should only be activated in the event of a low AC input supply (90V-150V RMS 50/60 Hz) after a controlled delay. The 2-Pulse Bridge Rectifier can be the default topology.

Reliable Operation—once the Pump-Controller has decided to activate either the Voltage Doubler or the 2-Pulse Bridge, the control decision should remain LATCHED. This latched state can only be defeated if the supply is removed or an Over-Voltage fault occurs.

In the present application, the motor-control subsystem 11 comprises a DC-to-AC power inverter 12 (shown in FIG. 5) for operating the 3-phase AC induction pump. A stand-alone inverter could be implemented, but the pump controller 1 according to the present embodiment provides pump control and inverter functionality within a single control module. The inverter 12 provides the following functions:

Consistent Motor Speed Control—the fundamental inverter output frequency is independent of the AC input supply frequency and can provide consistent pumping performance at both 50 & 60 Hz AC input supplies.

Controlled Starting Currents—the inverter can limit the starting current of the motor to safe and controllable levels, thereby reducing the necessity for over-designed input fusing to cope with excessive starting currents, e.g. up to 8 times rated current.

Intelligent Control—embedding Inverter Technology within the pump controller 1 can provide flexible speed control, e.g. reduced speed for power saving applications.

Figure 2:
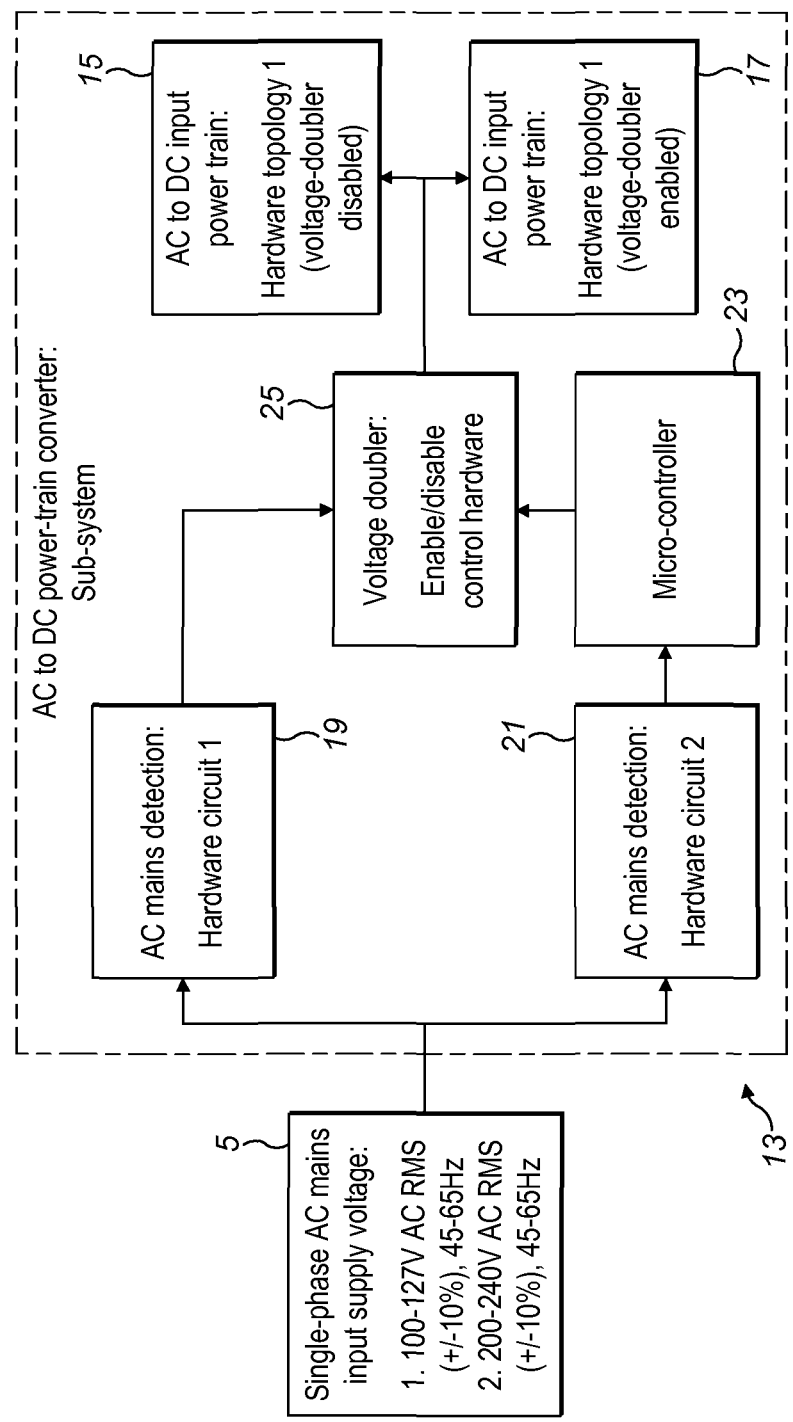
FIG. 2 shows a block diagram of the AC to DC power-train converter.
Figure 3:
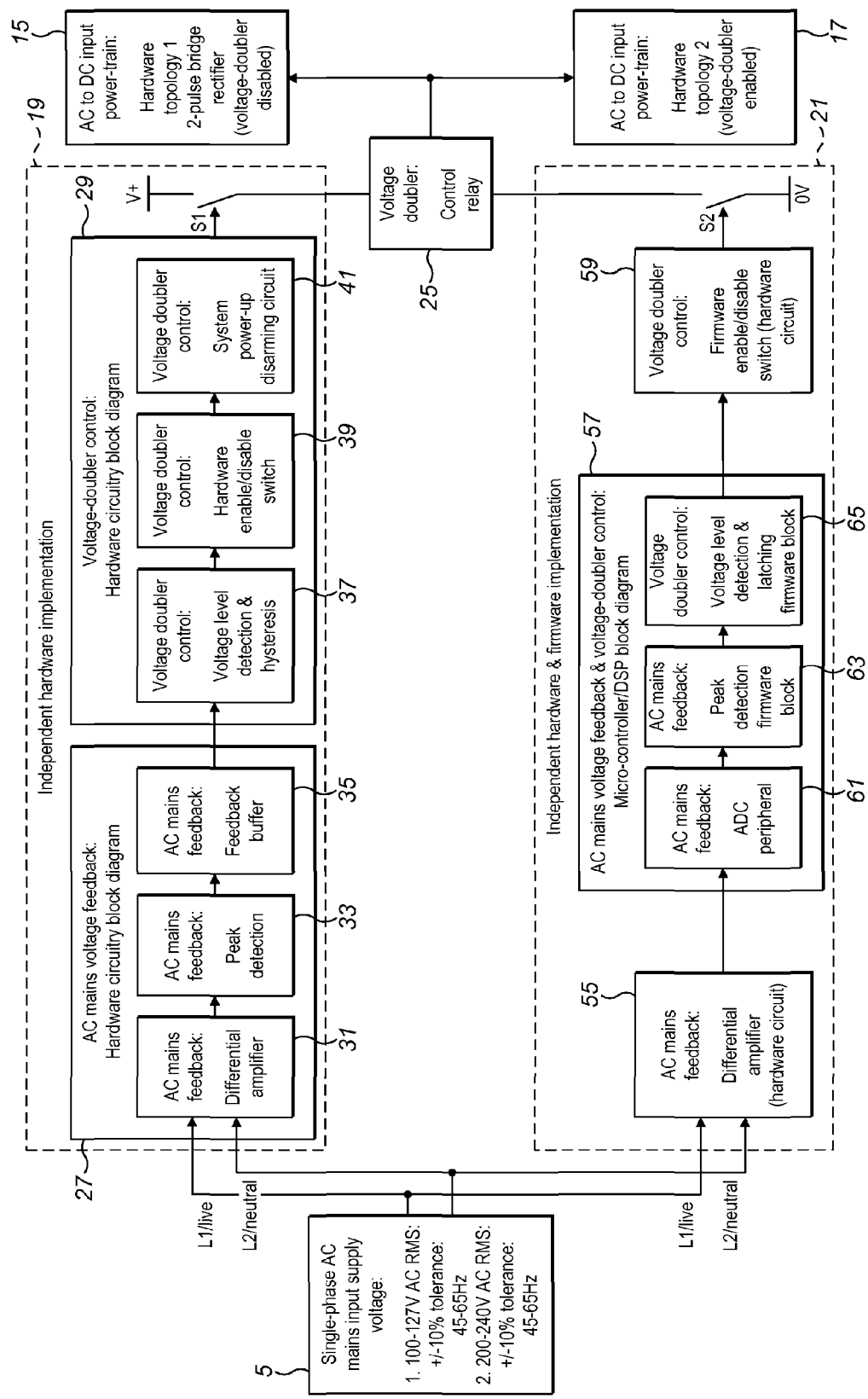
FIG. 3 shows a block diagram of the control module for the AC to DC power train converter.
Figure 4:
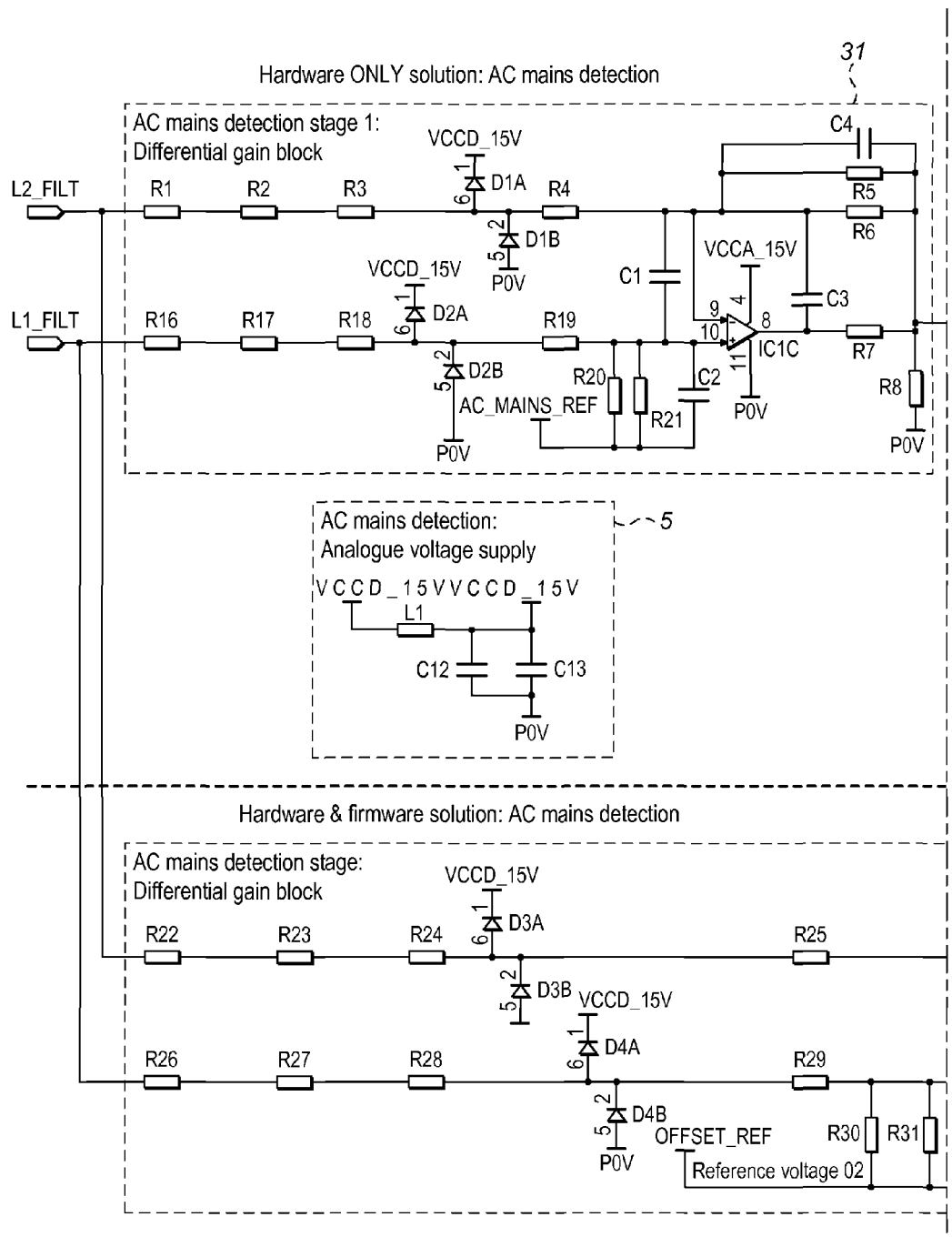
FIG. 4 shows a circuit diagram of the first and second AC detection circuits.
Figure 4:
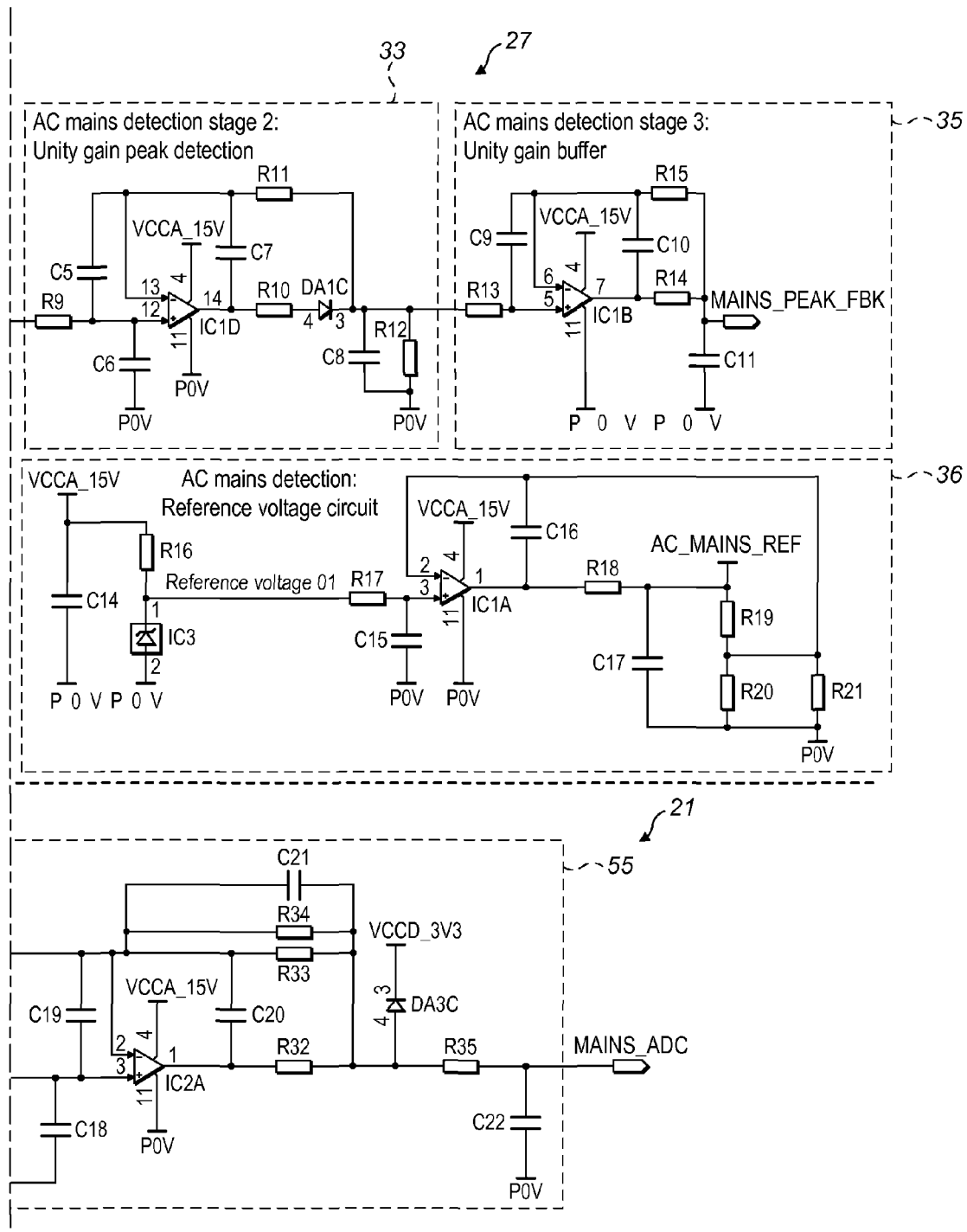

As shown in FIG. 2, the control module 13 comprises a first AC mains detection circuit 19, a second AC mains detection circuit 21, a micro-controller 23 and a switch control module 25 for selectively engaging the first and second AC-to-DC converters 15, 17. Specifically, the micro-controller 23 is a Digital Signal Processor (DSP) with a primary function of Motor-Control. Active control of the Voltage-Doubler is a peripheral function within the DSP. A schematic of the first and second AC detection circuits 19, 21 is shown in FIG. 3 and a circuit diagram is shown in FIG. 4. The first and second AC detection circuits 19, 21 will now be described in more detail.

The first AC detection circuit 19 is implemented entirely in hardware and comprises an AC mains voltage hardware feedback module 27 and a hardware voltage doubler control module 29. The hardware feedback module 27 comprises a first differential amplifier 31, a peak detection circuit 33 and a feedback buffer 35. As shown in FIG. 4, a reference voltage module 36 is provided to generate an AC reference signal (AC_MAINS_REF). The first differential amplifier 31 performs scaling to represent the input AC mains voltage as a signal ranging from 0V to 15V. The peak detection circuit 33 outputs a DC voltage equal to the peak value of the AC voltage signal from the first differential amplifier 31. The feedback buffer 35 preserves the output signal from the peak detection circuit 33 for subsequent detection by the hardware voltage doubler control module 29.

The hardware voltage doubler control module 29 takes the analogue output signal from the first differential amplifier 31 and performs "peak detection" on the attenuated signal. This provides a discrete value which represents the peak value of the AC input voltage. The peak detection circuit is heavily filtered to deal with supply disturbances and voltage surges. After the peak detection stage, the attenuated discrete value is further buffered by the feedback buffer 35. The feedback buffer 35 provides a low impedance output source (MAINS_PEAK_FBK) for the circuits located downstream. Consequently, the output signal (MAINS_PEAK_FBK) is not affected by downstream circuit loading.

The hardware voltage doubler control module 29 comprises a voltage level detection and hysteresis module 37, a hardware enable/disable switch 39 and a disarming module 41. The hardware voltage doubler control module 29 will now be described with reference to the circuit diagram shown in FIG. 5.

The voltage level detection and hysteresis module 37 comprises a level detection circuit 43 and a hysteresis circuit 45. The level detection circuit 43 compares the signal from the feedback buffer 35 in the hardware feedback module 27 with a predetermined reference to determine whether the AC mains supply is in a high range (e.g. 180-264 Vac RMS) or in a low range (e.g. 90-140 Vac RMS). The level detection circuit utilizes a TL431 voltage reference 43a. The hysteresis circuit 45 reinforces the output from the level detection circuit 43 to prevent switching as a result of small fluctuations in the AC mains supply voltage. The hardware enable/disable switch 39 comprises a level detection switch circuit 47 and outputs a first control signal S1 to identify whether the first detector 19 has detected a high range or a low range for the mains voltage supply. The first control signal S1 may be amplified by a Darlington switch 49 to actuate a control relay 51.

The disarming module 41 comprises a passive timer circuit 53 which prevents the hardware voltage doubler control module 29 operating until after a period of time following initial power-up has elapsed. Specifically, the hardware voltage doubler control module 29 can operate only once a capacitor in the timer circuit 53 has been charged. The timer circuit 53 serves as a passive timer to prevent the first control signal S1 being output from the hardware voltage doubler control module 29 immediately after the initial power-on. The enforced time delay allows the mains supply voltage to stabilize before the first control signal S1 is output.

The hysteresis circuit 45 helps prevent erroneous changes in the first control signal S1, for example due to perturbations in the mains supply voltage. Specifically, the hysteresis circuit 45 decreases the threshold signal change required to alter the first control signal S1. If the level detection circuit 47 determines that the AC mains supply is in a high range, the hysteresis circuit 45 will ensure that the first control signal S1 does not subsequently change unless a change in the detected peak voltage exceeds a decreased threshold level (for example 100 volts). The hysteresis circuit 45 thereby protects the first control signal S1 from changes due to fluctuations in the mains supply voltage.

The second AC mains detection circuit 21 is implemented using a combination of hardware and firmware. More specifically the functions of the hardware feedback module 27 and the hardware voltage doubler control module 29 are combined and implemented in firmware provided on a digital signal processor (not shown).

As shown in FIG. 3, the second AC mains detection circuit 21 comprises a second differential amplifier 55; a combined AC mains voltage feedback and voltage doubler control module 57 implemented in firmware; and a firmware implemented enable/disable switch 59.

The combined feedback and voltage doubler control module 57 comprises an analogue-to-digital (ADC) peripheral 61, a firmware implemented peak detector 63 and a firmware implemented voltage level detector and latching module 65.

The second differential amplifier 55 performs the same function as the first differential amplifier 31 and the analogue output (MAINS_ADC) is converted to a digital signal by the ADC peripheral 61. The firmware implemented peak detector 63 determines the peak value of the converted digital signal. The firmware voltage level detector determines whether the peak value represents an AC mains supply having a high voltage range (i.e. 180-264 Vac RMS) or a low voltage range (i.e. 90-140 Vac RMS). In addition, the firmware performs peak detection on the ADC value (MAINS_ADC) with digital filtering. The measured peak value is then compared with a voltage range to determine which AC-to-DC converter should be implemented. A second control signal S2 is output from the firmware enable/disable switch 59 to identify whether the second detector 21 has detected a high range or a low range for the voltage mains supply.

The first and second control signals S1, S2 are supplied to the switch control module 25. The switch control module 25 comprises a control circuit 67 and a voltage doubler control relay 69 for selecting either the first AC-to-DC converter 15 or the second AC-to-DC converter 17. The first and second control signals S1, S2 could be an analogue or digital signal. In the preferred embodiment S1 and S2 are digital signals.

The control circuit 67 comprises a logic AND circuit which enables the voltage doubler relay 69 to select the second AC-to-DC converter 17 only when the first and second control signals S1, S2 both indicate that the AC mains supply is operating in a low range (i.e. 90-140 Vac RMS). Thus, the voltage doubler circuit 73 is enabled only when both the first and second AC mains detection circuits 19, 21 have determined that the AC mains supply is operating in a low range. If neither of the first and second AC mains detection circuits 19, 21, or only one of them, determines that the AC mains supply is operating in a low range, the voltage doubler circuit 73 is not enabled.

Figure 5:
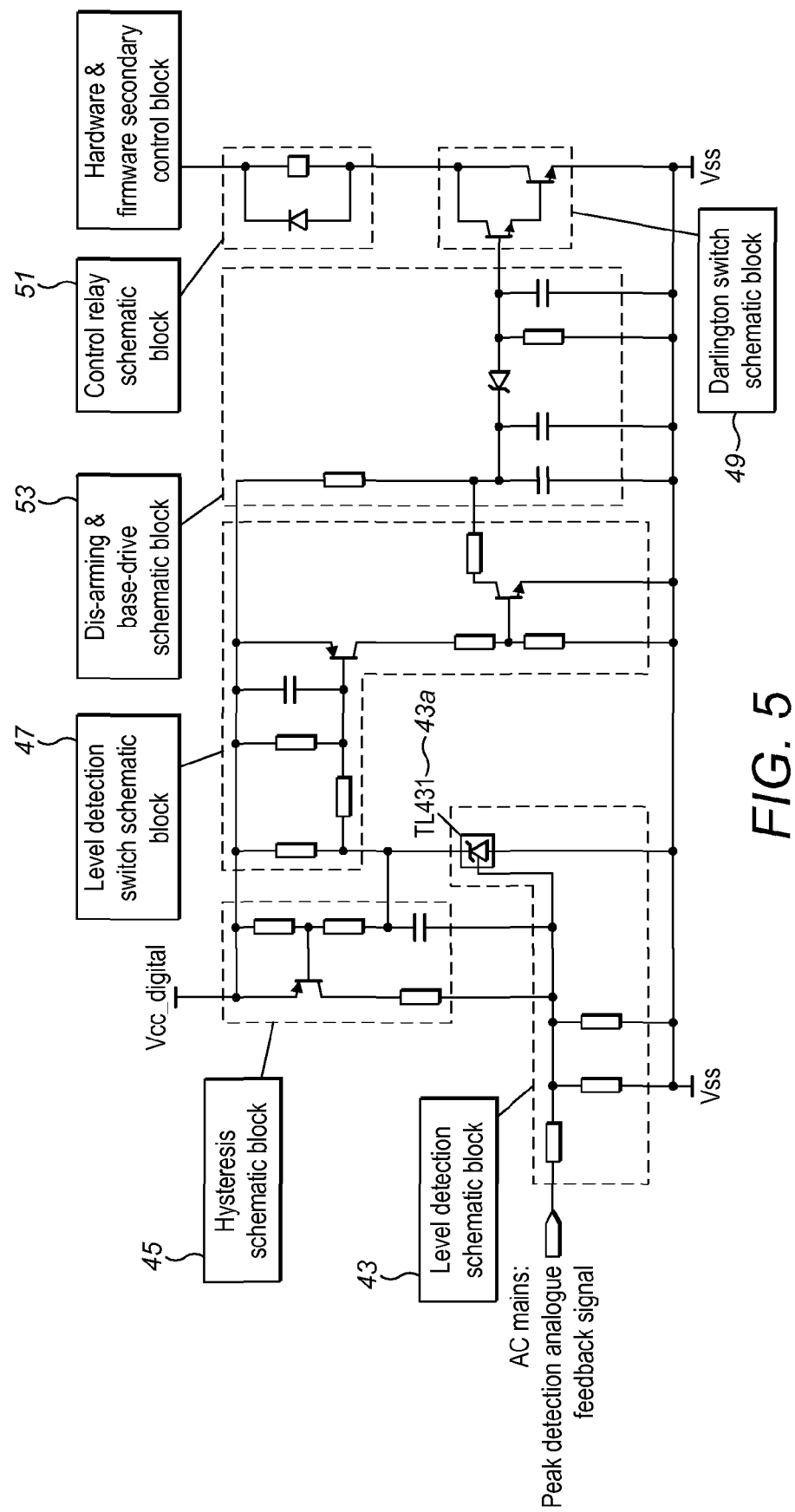
FIG. 5 shows a schematic for a hardware implemented voltage detector module.

As a failsafe, the default position of the voltage doubler control relay 69 is to select the first AC-to-DC converter 15 which bypasses the voltage doubler circuit 73 (i.e. the voltage doubler circuit 73 is disabled), as shown in FIG. 5. In the event of the failure of either the first AC mains detection circuit 19 or the second AC mains detection circuit 21, the voltage doubler circuit 73 will not be enabled.

The firmware associated with the second differential amplifier 55 implements timing delays before performing any control actions. The two implemented delays are as follows:

Power-On Reset Delay: after the processor has successfully come out of reset, it waits a further 1 second before reading the ADC peripheral. This gives the ADC and reference voltages sufficient time to stabilize.

Voltage-Doubling Delay: the firmware samples the (MAINS_ADC) signal for a further pre-defined time period, for example 1 second, to determine the peak value of the input supply. The signal is sampled at a frequency of 8 kHz, which equates to 160 samples for 1 cycle of mains at 50 Hz; and 133 samples for 1 cycle of the mains at 60 Hz. The peak value is filtered throughout the pre-defined time period.

Once the firmware has determined the status of the AC Mains Supply the decision is LATCHED. The micro-controller subsequently enables or continues to disable one half of the voltage-doubler control switch. The firmware control routine is only initiated during a start-up routine within the firmware. In the event of an over-voltage trip, the firmware turns off its half of the voltage-doubler control switch; this action disables the voltage-doubler topology. This fault condition is only reset by cycling power to the pump system or performing a processor reset.

The first AC detection circuit 19 which is implemented in hardware only provides similar functionality as that described above for the second AC detection circuit 21.

Figure 6:
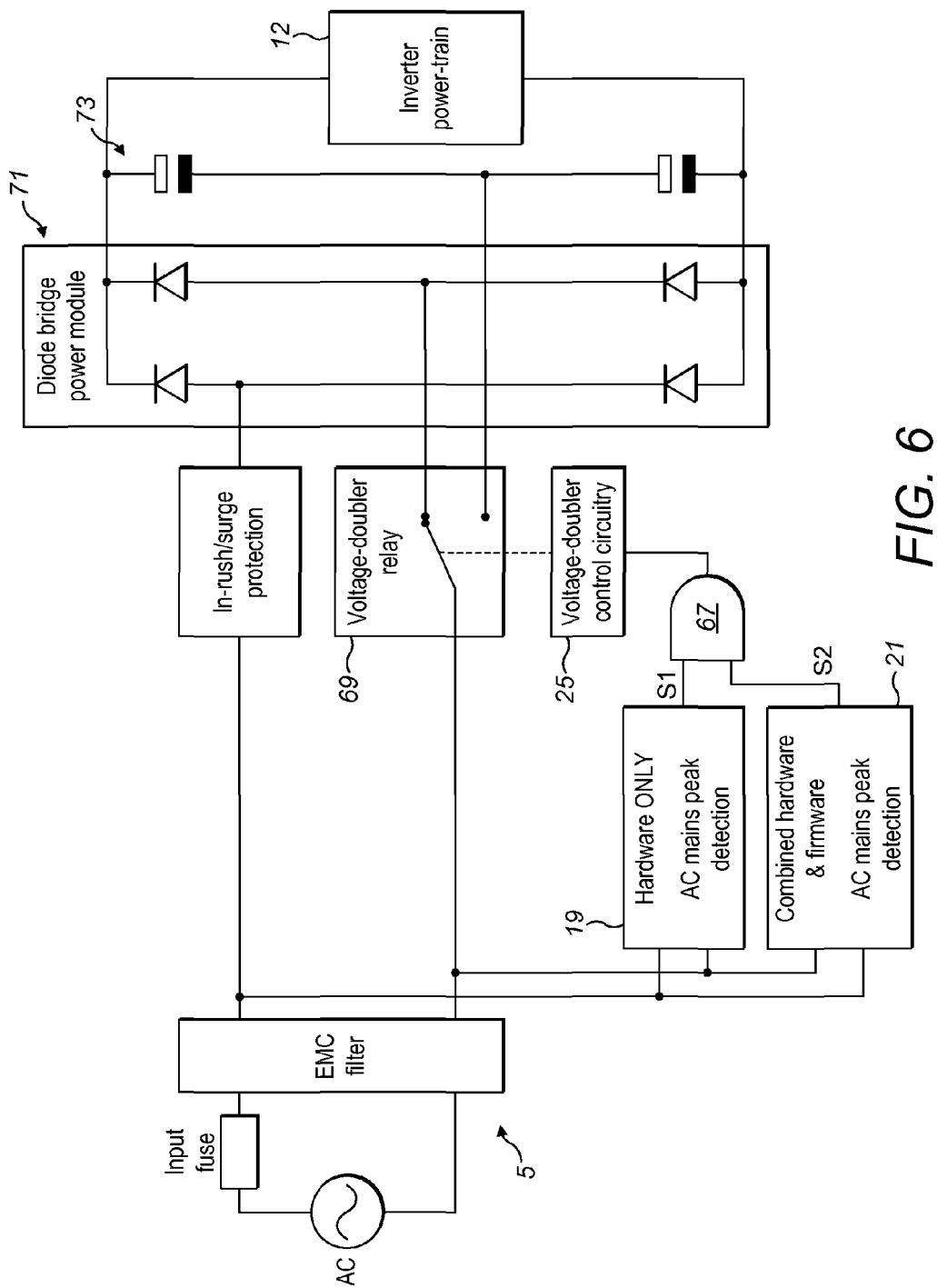
FIG. 6 shows a schematic for a voltage doubler for the AC-to-DC power train converter.

Although the first and second AC-to-DC converters 15, 17 have been described as discrete components, a single-phase diode bridge rectifier 71 is common to both the first and second AC-to-DC converters 15, 17, as shown in FIG. 6.

The operation of the pump controller 1 according to the present disclosure will now be described.

Following initial power-on of the pump controller 1, the first AC mains detection circuit 19 is disabled by the disarming module 41 for a period of time, typically 500 ms, to allow the supply voltage to stabilize. This time delay prevents the first AC detection circuit 19 from erroneously determining that the AC mains supply is operating in a low voltage range (e.g. 120 Vac RMS) during power-up conditions. As the control circuit 67 comprises a logic AND circuit, the voltage doubler control relay 69 cannot receive the required first and second control signals S1, S2 during this initial period so the voltage doubler circuit 73 cannot be enabled.

After this initial time period has elapsed, the first and second AC mains detection circuits 19, 21 are both operational. The first and second AC mains detection circuits 19, 21 operate independently at the same time to determine the voltage range of the AC mains supply. The first and second AC mains detection circuits 19, 21 each determine whether the AC mains supply voltage is in a high range (i.e. 180-264 Vac RMS) or in a low range (i.e. 90-140 Vac RMS) and output respective first and second control signals S1, S2.

Once the first control signal S1 has been determined, the hysteresis circuit 45 prevents false triggering due to small fluctuations in the peak mains supply voltage, for example due to signal noise. The hysteresis circuit 45 decreases the threshold signal change required to alter the first control signal S1. The threshold is decreased only after a decision has been made to disable the voltage doubler. For example, if the level detection circuit 47 determines that the AC mains supply is in a high range, a significant reduction in the detected AC mains supply voltage (for example 100 volts) is required to reverse the first control signal S1. Conversely, if the level detection circuit 47 determines that the AC mains supply is in a low range, a significant increase in the detected AC mains supply voltage (for example 100 volts) is required to reverse the first control signal S1. The hysteresis circuit 45 thereby prevents the first control signal S1 from switching between states in response to small changes in the detected AC mains supply signal.

The first and second control signals S1, S2 are input to the logic AND circuit 67 in the switch control module 25. If the first and second control signals S1, S2 both indicate that the AC mains supply voltage is in a low range, the switch control module 25 enables the voltage doubler control relay 69 to engage the voltage doubler circuit 73. The diode bridge power module 71 converts the AC mains supply to a DC supply and the voltage doubler circuit 73 doubles the voltage supplied at the DC link voltage source 7. An AC mains supply voltage of 120 Vac RMS would be converted to a DC voltage of approximately 340 Vdc at the DC link voltage source 7.

If neither of the first and second control signals S1, S2, or only one of the first and second control signals S1, S2 indicates that the AC mains supply voltage is in a low range, the switch control module 25 does not enable the voltage doubler control relay 69. Accordingly, the voltage doubler circuit 73 is not enabled. The diode bridge power module 71 converts the AC mains supply to a DC voltage supplied at the DC link voltage source 7. An AC mains supply voltage of 240 Vac RMS would be converted to a DC voltage of approximately 340 Vdc at the DC link voltage source 7.

The power inverter 12 converts the DC voltage supplied at the DC link voltage source 7 to AC to power an induction motor for the pump. The same signal can be used whether it is an induction motor, a permanent magnet motor or a brushless DC motor.

As the voltage supplied to the DC link voltage source 7 is within the range 254 Vdc to 396 Vdc, the components in the pump unit can be selected to operate within this specific range.

The provision of first and second AC mains detection circuits 19, 21 provides a failsafe for the pump controller 1. The pump controller 1 provides two independent detection and control circuits to select the appropriate AC-to-DC Converter topology; this duplication provides safety, via redundancy, in the event of a single failure mode with one of the control circuits. Furthermore, both independent control circuits 19, 21 can be configured to default the AC-to-DC power converter 3 to the 2-Pulse bridge rectifier topology to ensure the safe power-up of the pump controller 1. Once the two independent control circuits 19, 21 have detected and determined the status of the AC input supply, the control circuits 19, 21 can both be configured to latch the state of the AC-to-DC power converter 3. This latched state is only changed in the event that a DC link over-voltage trip occurs; or a system power-down occurs.

In the event that either one of the AC mains detection circuits 19, 21 fails (i.e. a single failure mode), the pump controller will not enable the voltage doubler circuit 73. Thus, damage to the client interface module 9 and the motor control module 11 will be avoided. It will be appreciated that the user may be provided with an alert in the event that one of said AC mains detection circuits 19, 21 fails.

Figure 7:
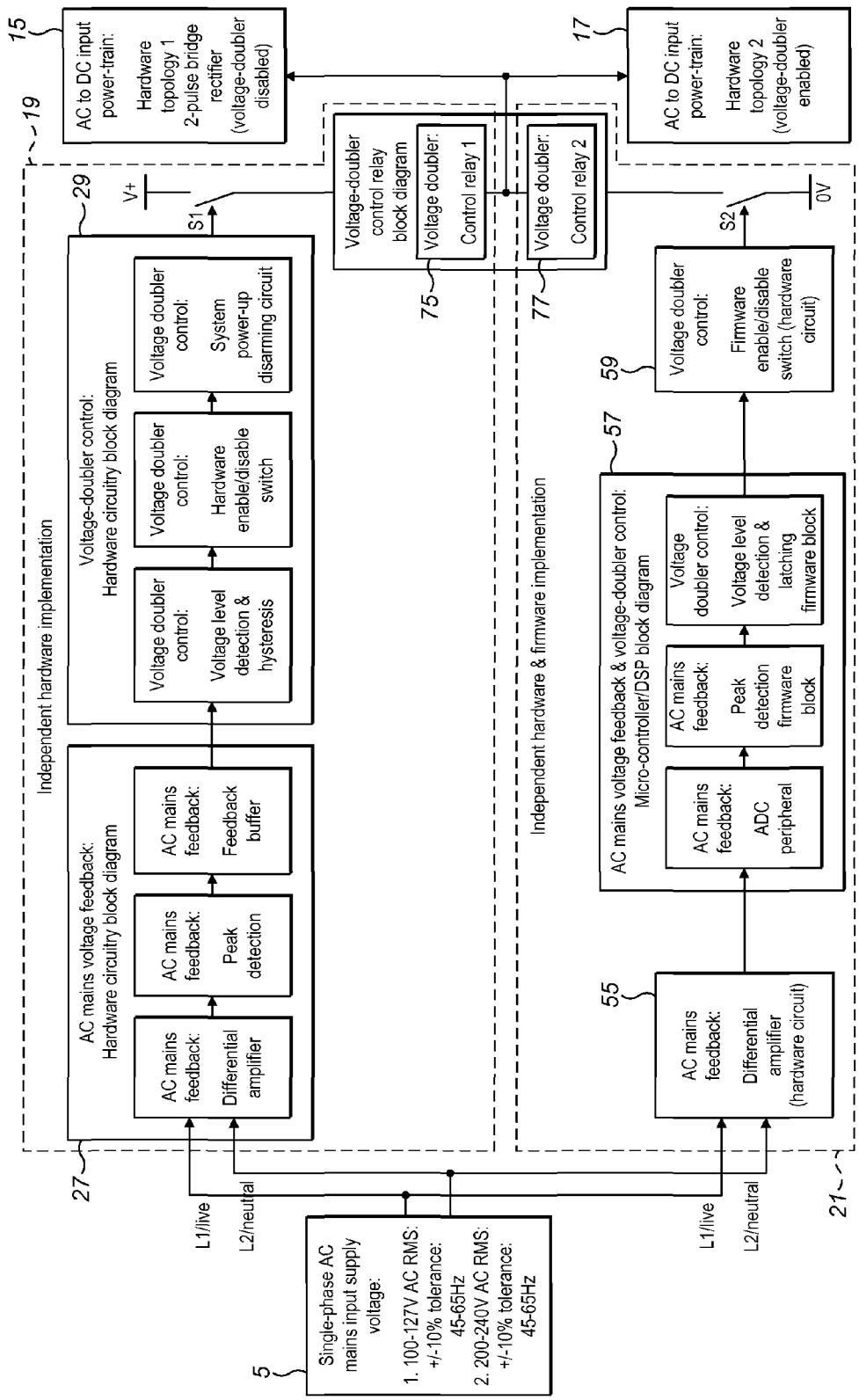
FIG. 7 shows a block diagram of a modified control module for the AC to DC power train converter.

A modified version of the control module 13 is illustrated in FIG. 7. For the sake of brevity, like reference numerals shall be used for like components.

In the modified arrangement, the voltage doubler control circuit 25 is incorporated into the first and second mains voltage detectors 19, 21. Specifically, the first mains voltage detector 19 comprises a first voltage doubler control relay 75 and the second mains voltage detector 21 comprises a second voltage doubler control relay 77. The first and second voltage doubler control relays 75, 77 disable/enable the voltage doubler circuit 73. The operation of the modified version of the control module 13 is unchanged. Specifically, the voltage doubler circuit 73 is enabled only if both the first and second mains voltage detectors 19, 21 determine that the AC mains supply voltage is in a low range (e.g. 120V).

It will be appreciated that various changes and modifications can be made without departing from the scope of the present disclosure.

The invention claimed is:

1. A pump comprising:
a control module for a voltage converter, the control module comprising:
an input configured to connect to an AC mains supply having an AC mains operating voltage range;
a first AC mains detector configured to detect the AC mains operating voltage range of the AC mains supply and generate a first control signal to identify the detected AC mains operating voltage range;
a second AC mains detector configured to detect the AC mains operating voltage range of the AC mains supply and generate a second control signal to identify the detected AC mains operating voltage range, wherein the first AC mains detector and the second AC mains detector are electrically connected to the input in parallel; and
at least two switches configured to receive the first control signal and the second control signal and at least one of selectively enable or selectively disable a voltage multiplier in response to the first and second control signals and enable the voltage converter to output a DC voltage to an inverter.

2. The pump of claim 1, wherein the at least two switches are configured to at least one of selectively enable or disable the voltage multiplier only when the first and second control signals both identify the same detected AC mains operating voltage range.

3. The pump of claim 1, wherein the at least two switches are configured to selectively enable the voltage multiplier when the first control signal and the second control signal both identify a low detected AC mains operating voltage range.

4. The pump of claim 1, wherein the at least two switches are configured to selectively disable the voltage multiplier when the first control signal and the second control signal both indicate that the AC mains supply voltage is in a high AC mains operating voltage range.

5. The pump of claim 1, wherein the first AC mains detector and the second AC mains detector are operable independently of each other, and wherein the first AC mains detector and the second AC mains detector detect the AC mains operating voltage range simultaneously.

6. The pump of claim 1, wherein the first detector is implemented in hardware, and wherein the second detector is implemented in a combination of hardware and firmware.

7. The pump of claim 1, further comprising at least one of a first latch for latching the first control signal or a second latch for latching the second control signal.

8. The pump of claim 1, further comprising a hysteresis control configured to control at least one of the first control signal or the second control signal.

9. The pump of claim 1, further comprising a disarming circuit configured to disable the control module during power-up.

10. The pump of claim 1, wherein a first switch of the at least two is associated with the first AC mains detector and a second switch of the one or more switches is associated with the second AC mains detector.

11. The pump of claim 1, wherein the voltage multiplier comprises a voltage doubler.

12. A pump comprising:
a voltage converter, the voltage converter comprising:
a voltage multiplier;
a control module comprising:
an input configured to connect to an AC mains supply having an AC mains operating voltage range;
a first AC mains detector configured to detect the AC mains operating voltage range of the AC mains supply and generate a first control signal to identify the detected AC mains operating voltage range;
a second AC mains detector configured to detect the AC mains operating voltage range of the AC mains supply and generate a second control signal to identify the detected AC mains operating voltage range, wherein the first AC mains detector and the second AC mains detector are electrically connected to the input in parallel;
at least two switches configured to receive the first control signal and the second control signal and at least one of selectively enable or selectively disable the voltage multiplier in response to the first and second control signals; and
an output configured to supply a DC voltage to an inverter.

13. A method of controlling a voltage converter for a pump, the method comprising:
receiving, by an input, an AC mains supply having an AC mains operating voltage range;
detecting, by a first AC mains detector, the operating voltage range of the AC mains supply;
generating, by the first AC mains detector, a first control signal to identify the detected AC mains operating voltage range;
detecting, by a second AC mains detector, the AC mains operating voltage range of the AC mains supply, wherein the first AC mains detector and the second AC mains detector are connected to the input;
generating, by the second AC mains detector, a second control signal to identify the detected AC mains operating voltage range;
at least one of selectively enabling or disabling, by at least two switches, a voltage multiplier in response to the first and second control signals; and
supplying, by the voltage converter, a DC voltage to an inverter.

14. The method of claim 13, wherein the at least one of selectively enabling or disabling the voltage multiplier comprises at least one of selectively enabling or disabling the voltage multiplier only when the first and second control signals both identify the same detected AC mains operating voltage range.

15. The method of claim 13, wherein the at least one of selectively enabling or disabling the voltage multiplier comprises at least one of selectively enabling the voltage multiplier when the first control signal and the second control signal both indicate that the AC mains supply voltage is in a low AC mains operating voltage range.

16. A pump comprising:
a voltage multiplier control circuit, the voltage multiplier control circuit comprising:
- a first AC mains voltage level detector configured to detect an AC mains operating voltage range of an AC mains supply;
- a signal generator configured to generate a first control signal to identify the AC mains operating voltage range detected by the first AC mains voltage level detector;
- a second AC mains voltage level detector configured to detect the AC mains operating voltage range of the AC mains supply
- a second signal generator configured to generate a second control signal to identify the AC mains operating voltage range detected by the second AC mains voltage level detector; and
- at least two switches configured to receive the first control signal and the second control signal and at least one of enable or disable a voltage multiplier in response to the control signal and enable the voltage converter to output a DC voltage to an inverter.

17. The pump of claim 16, further comprising a hysteresis circuit configured to control the control signal.

18. The pump of claim 16, further comprising a disarming circuit configured to disable the control module during power-up.

19. The pump of claim 18, wherein the hysteresis circuit comprises a hardware circuit, and wherein the disarming circuit comprises a hardware circuit.

20. The pump of claim 16, wherein the voltage multiplier control circuit is implemented in hardware.

21. The pump of claim 16, further comprising a peak detector configured to detect the peak voltage of the AC mains supply and output a signal to the voltage level detector.

22. The pump of claim 21, further comprising a feedback buffer configured to protect the signal output by the peak detector.

23. A pump comprising:
a control module for a voltage converter, the control module comprising:
- a plurality of voltage multiplier control circuits, wherein at least one voltage multiplier control circuit of the plurality of voltage multiplier control circuits comprises an AC mains voltage level detector configured to detect the operating voltage range of an AC mains supply, a signal generator configured to generate a control signal to identify the detected AC mains operating voltage range, and at least two switches configured to at least one of enable or disable a voltage multiplier in response to the control signal to enable the voltage converter to output a DC voltage to an inverter, and wherein the plurality of voltage multiplier control circuits are electrically connected to an input of the control module in parallel and operable to concurrently detect the AC mains operating voltage range of the AC mains supply.

24. The pump of claim 23, wherein the control signals from the voltage multiplier control circuits are input into a logic control circuit.

25. A method of controlling a voltage multiplier for a pump, the method comprising:
- receiving, by an input, an AC mains supply having an AC mains operating voltage range;
- detecting, by a first AC mains voltage level detector, the AC mains operating voltage range of the AC mains supply;
- generating, by the first AC mains voltage level detector, a first control signal to identify the detected AC mains operating voltage range;
- detecting, by a second AC mains voltage level detector, the AC mains operating voltage range of the AC mains supply;
- generating, by the second AC mains voltage level detector, a second control signal to identify the detected AC mains operating voltage range; and
- at least one of enabling a disabling, by at least two switches, a voltage multiplier in response to the first control signal and the second control signal to enable the voltage converter to output a DC voltage to an inverter.

* * * * *